United States Patent [19]

Ichikawa et al.

[11] 4,297,713
[45] Oct. 27, 1981

[54] LASER RECORDING APPARATUS

[75] Inventors: Junji Ichikawa; Nobuhiro Imai; Kimio Kohno; Koichi Kadokura; Masaaki Ishii, all of Kawasaki, Japan

[73] Assignee: Canon Kabushiki Kaisha, Tokyo, Japan

[21] Appl. No.: 43,246

[22] Filed: May 29, 1979

[30] Foreign Application Priority Data

Jun. 3, 1978 [JP] Japan .................................. 53-66858
Sep. 21, 1978 [JP] Japan ................................. 53-117237

[51] Int. Cl.³ ........................................... G01D 15/14
[52] U.S. Cl. .................................... 346/108; 346/160; 350/6.8; 355/3 R
[58] Field of Search ........................ 346/108, 160, 145; 355/3 R; 354/5; 350/6.8, 6.7

[56] References Cited

U.S. PATENT DOCUMENTS

| | | | |
|---|---|---|---|
| 3,186,000 | 5/1965 | Sihvonen | 346/145 X |
| 4,059,833 | 11/1977 | Kitamura | 346/108 |
| 4,070,681 | 1/1978 | Ichikawa | 346/160 |
| 4,171,902 | 10/1979 | Imai | 355/3 R X |

Primary Examiner—Joseph W. Hartary
Attorney, Agent, or Firm—Fitzpatrick, Cella, Harper & Scinto

[57] ABSTRACT

A laser recording apparatus includes a laser optical unit having an integral combination of a laser for emitting a laser beam and an optical system for converting the laser beam into an expanded and collimated beam; a deflector unit for directly receiving the laser beam emergent from the laser optical unit and directing the laser beam toward a recording medium; a photoreceptor unit having an integral combination of a reflecting member for reflecting the laser beam deflected by the deflector unit and a photoreceptor for receiving the laser beam reflected by the reflecting member; a support member having standard portions respectively for mounting the laser optical unit, the deflector unit and the photoreceptor unit.

3 Claims, 12 Drawing Figures

LASER RECORDING APPARATUS

BACKGROUND OF THE INVENTION

1. Field of the Invention

The present invention relates to a laser recording apparatus capable of high-speed reproduction of image information such as characters or graphics from a computer or a facsimile transmitter, and more particularly to a laser recording apparatus capable of high-speed high-quality by deflecting and modulating a laser beam according to the image information such as graphics or characters from a computer or a facsimile transmitter.

2. Description of the Prior Art

Laser beam printers for performing high-speed recording by modulating a laser beam with a recording signal and scanning a recording medium with thus modulated laser beam are already known as disclosed for example in the U.S. Pat. No. 4,059,833.

In the conventional laser recording apparatus there have been required a vernier adjuster or an optical mirror in order to introduce the light beam from a laser into a determined position of the modulator, and a plurality of optical mirrors in order to bring the modulated beam from the modulator to a required position. For this reason the beam collimation requires a complex and time-consuming procedure, the inevitably long optical path hinders the size-reduction of the apparatus, and the optical loss in the modulator or optical mirrors necessitates the use of a high-powered laser.

In addition the use of optical mirrors gives rise to vibration of the light beam by the eventual mechanical vibration, thus deteriorating the stability of the recorded image on a photosensitive member and leading to lowered image quality. Also in case of replacement or adjustment of the laser or the beam deflector there is generally required the readjustment of the light path in the entire recording apparatus, thus rendering the replacement or adjustment of components extremely difficult.

SUMMARY OF THE INVENTION

The object of the present invention, therefore, is to provide a laser recording apparatus capable of recording without the above-explained drawback and with stable performance over a prolonged period.

Another object of the present invention is to provide a laser recording apparatus wherein the irradiation of a particular position with the laser beam can be achieved in a significantly simplified manner.

Still another object of the present invention is to provide a laser recording apparatus wherein the replacement or adjustment of components can be achieved in a simple manner.

Still another object of the present invention is to provide a laser recording apparatus wherein the number of mirrors required for bringing the laser beam to a desired position can be reduced.

BRIEF DESCRIPTION OF THE DRAWINGS

FIGS. 1 to 4 are views of a recording apparatus embodying the present invention wherein

FIGS. 7 to 9 are views of a laser unit wherein

DESCRIPTION OF THE PREFERRED EMBODIMENTS

The present invention will now be clarified in detail by the following explanation on the preferred embodiments thereof taken in conjunction with the attached drawings.

Figure 1:
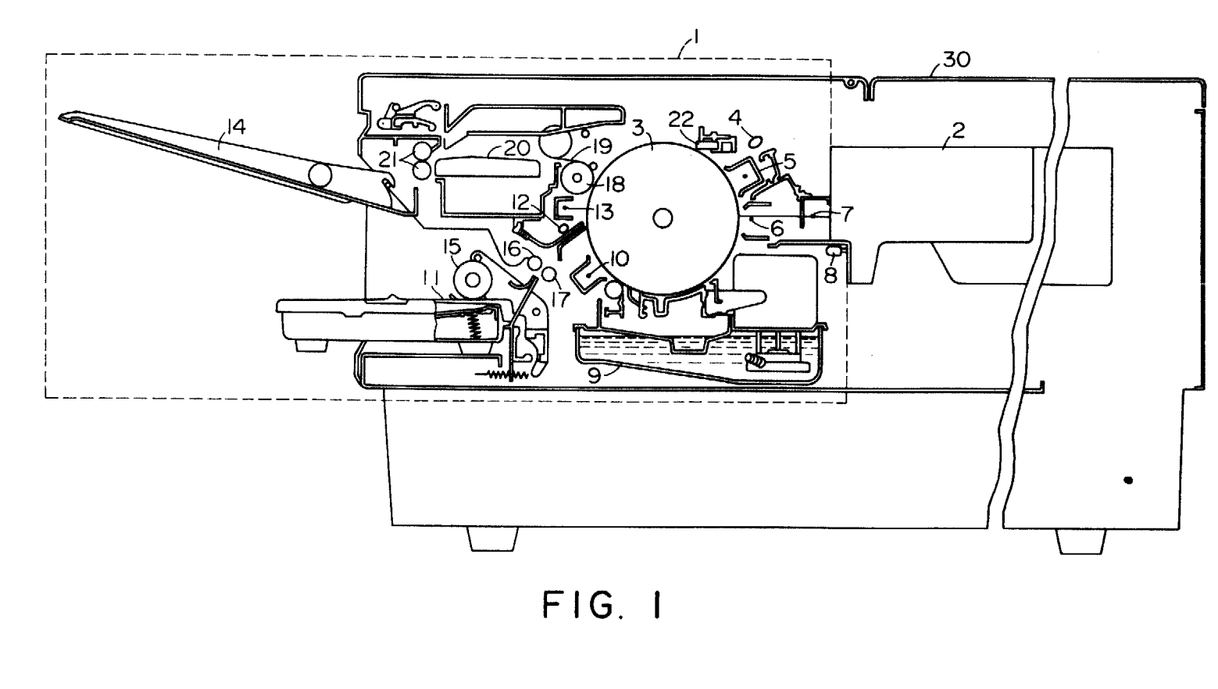
FIG. 1 is a lateral cross-sectional view thereof.
Figure 2:
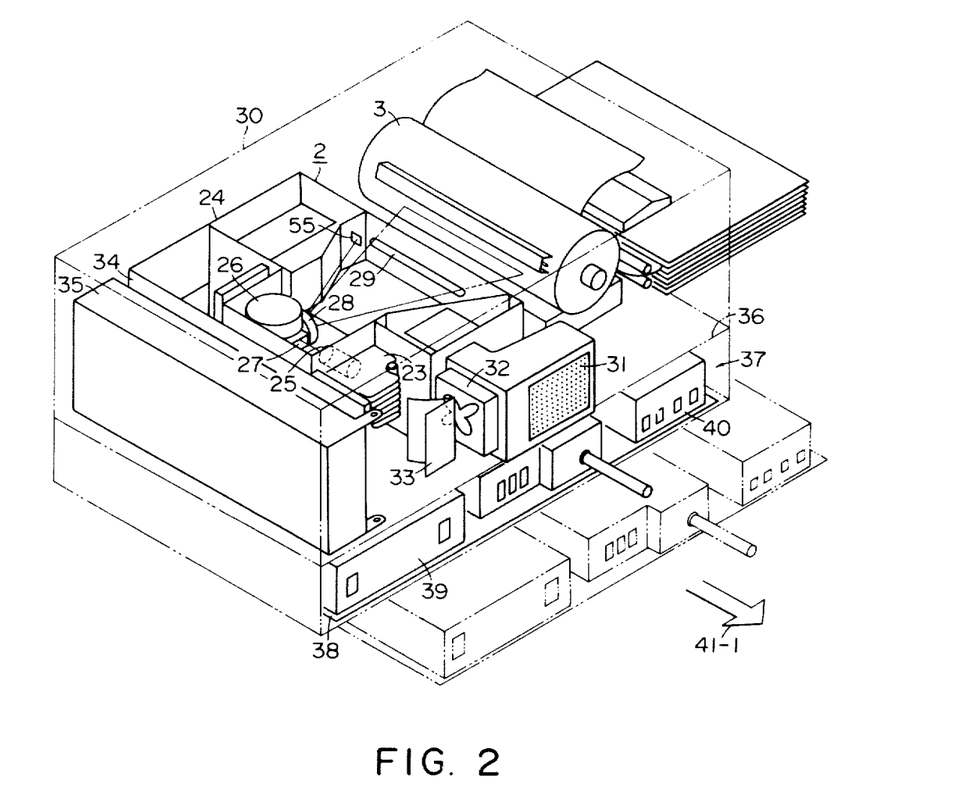
FIG. 2 is a perspective view thereof.

Referring to FIGS. 1 and 2 showing the recording apparatus embodying the present invention respectively in a lateral cross-sectional view and a perspective view, there are shown an electrophotographic recording section 1 for example as disclosed in the U.S. Pat. Nos. 3,666,363 and 4,071,361 assigned to the assignee of the present application; an optical section 2 for supplying a laser beam modulated according to image information to said recording section 1; and a photosensitive drum 3 having a drum-shaped photosensitive member essentially composed of an electroconductive substrate, a photoconductive layer and an insulating layer, which is adapted to be uniformly charged, on the insulating surface thereof, either positively or negatively by means of a first corona charger 5 thereby capturing a charge of a polarity opposite to that of said charging at the interface of said photoconductive layer and insulating layer or within said photoconductive layer, then to be subjected to the irradiation by said laser beam 7 simultaneously with an AC corona discharge from an AC corona discharger 6 thereby forming a surfacial potential pattern on said insulating surface corresponding to the light intensity of said laser beam 7, and then to be exposed uniformly to the light of a flash exposure lamp 8 thereby forming an electrostatic latent image of an elevated contrast on said insulating surface, said latent image being developed in a developing station 9 with a developer essentially composed of charged colored particles to obtain a visible image which is transferred, after treatment by a positive charger 10, onto a transfer material 11 such as paper by means of a transfer charger 13 in combination with the exposure by a post-exposure lamp 12 for lowering the resistance of said photoconductive layer. Said transfer sheet 11 is separated, in a separating station 18, by means of a separating belt 19 from said photosensitive drum 3 and introduced into a fixing station 20 utilizing an infrared lamp or a hot plate wherein said transferred image is fixed to obtain an electrophotographic reproduced image. On the other hand said insulating surface is cleaned in a cleaning station 22 to eliminate eventually remaining charged particles, and is exposed to the light of a pre-exposure lamp 4 to lower the resistance of said photoconductive layer whereby the photosensitive drum 3 being prepared for repetitive use.

There is also shown a paper feed roller 15 which is maintained in continuous rotation and is adapted to be lowered onto the stacked transfer sheets to advance a transfer sheet 11 along the transport path thereof, said transfer sheet being advanced toward the portion for image transfer with an appropriate timing controlled by timing rollers 16, 17. The transfer sheet having the transferred toner image thereof is subjected to the image fixation in the fixing station 20 and then is ejected onto a tray 14 by means of a feed roller 21.

Now referring to FIG. 2 showing the relation between said recording section and the optical section 2, a laser unit 23 to be explained later is fixed on the outside of a casing 24 of said optical section 2 and emits a laser beam which is introduced through a beam expander system 25 into an inlet aperture 27 of a deflector 26. Said deflector 26 is designed to deflect the introduced laser beam by rotating a polygonal mirror, for example an octagonal mirror with a motor, and the beam thus deflected is displaced at a constant speed over the recording area on the photosensitive drum 3 by means of an f-θ lens 28 mounted on the outlet aperture of said deflector 26.

Said casing 24 is provided with a slit 29 corresponding to the path of said deflected beam irradiating said photosensitive drum 3, so that the beam falling on a mirror 55 to be explained does not pass through said slit 29.

In a part of a casing 30 enclosing said recording apparatus there is provided an unrepresented aperture in facing relationship with a filter 31, through which clean air is inhaled by means of a fan 32 and divided by guide plates 33 into two streams one of which is for cooling said laser unit while the other of which is for cooling the control circuit units 34, 35 of the recording apparatus. Under said recording section 1 and optical section 2 and separated by a partition 36 there is provided a power supply section 37 including a low-voltage power source 39 and a high-voltage power source 40 which are mounted on a support 38 and rendered extractable from the casing 30 by sliding the support 38 in the direction of arrow 41-1.

Figure 3:
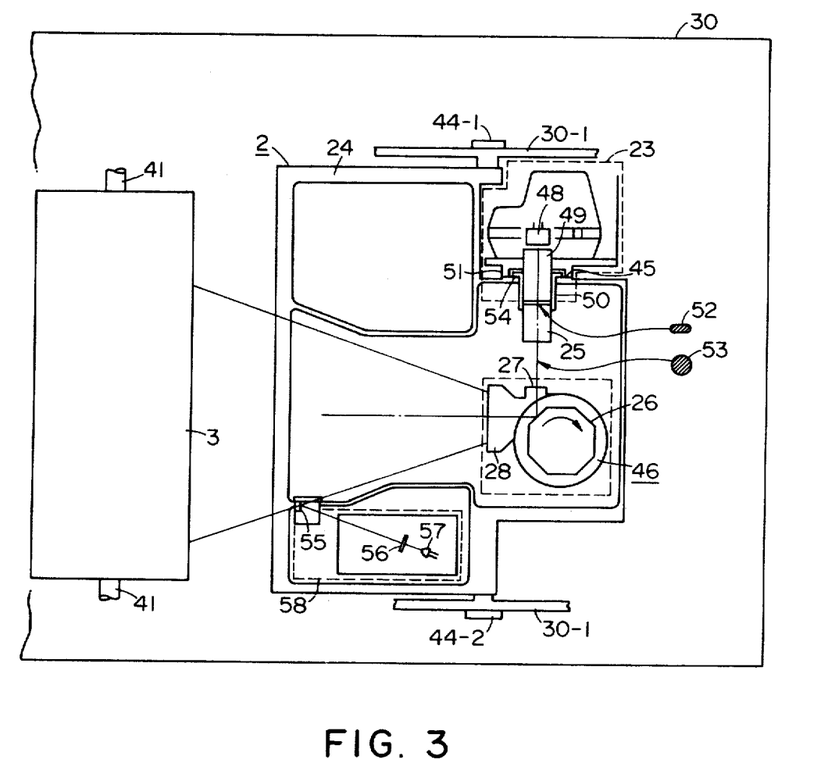
FIG. 3 is an upper plan view thereof.
Figure 4A:
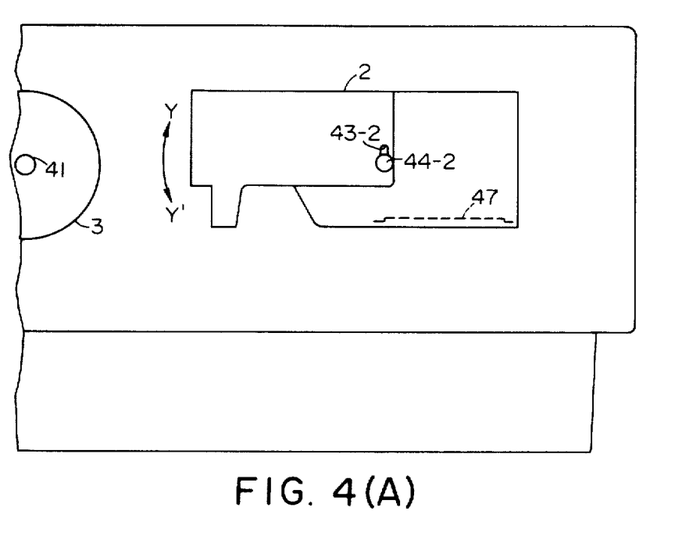
FIG. 4A is a partial lateral view thereof.
Figure 4B:
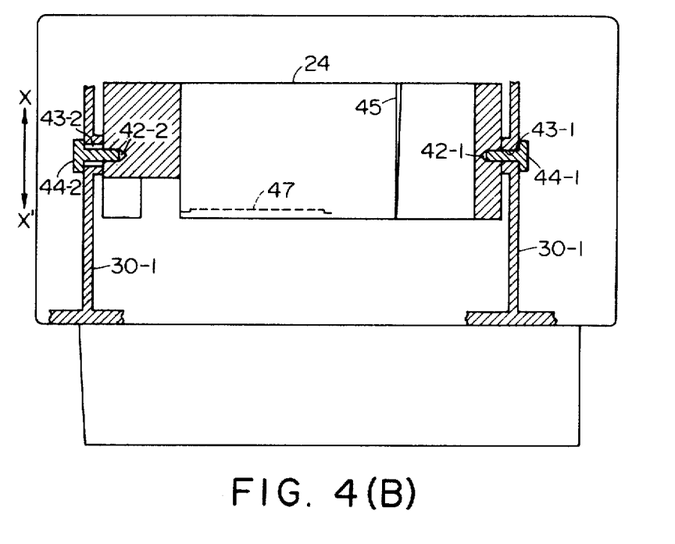
FIG. 4B is a partial rear view.

The aforementioned optical section 2 will now be further clarified by the following explanation with particular reference to FIGS. 3, 4A and 4B, showing said optical section 2 in the recording apparatus respectively in a plan view, a lateral view and a rear view.

At the right-hand side of the photosensitive drum 3 supported rotatably by a shaft 41 thereof on the casing 30, there is provided a casing 24 for the optical section (optical box) containing all the components necessary for forming the laser beam for irradiating the photosensitive drum 3. The various units constituting the optical section are respectively adjusted and mounted by positioning means to the casing 24 so as to satisfy the function thereof, so that the adjustment after mounting is rendered unnecessary. Consequently the components have excellent reproducibility in the reassembly after detachment for example for cleaning and interchangeability of the units. Said casing 24 is provided with two threaded holes 42-2, 42-2 for pivoting said casing, the axes of said holes 42 substantially coinciding each other and being approximately parallel to said shaft 41. On the other hand on said casing 30 there are provided frames 30-1 for mounting said casing 24 and provided with holes 43-1 and 43-2 respectively corresponding to said threaded holes 42-1 and 42-2. The hole 43-1 corresponding to said threaded hole 42-1 is provided with a diameter corresponding to that of a screw 44-1 to define the position thereof, while the hole 43-2 corresponding to the threaded hole 42-2 is an oblong hole of which shorter diameter corresponds to that of a screw 44-2, so that, when the screws 44-1, 44-2 are fitted into said threaded holes 42-1, 42-2 through said frames 30-1, the casing 24 is rendered displaceable, at the position of said screw 44-2, in the direction of X—X' shown in FIG. 4B. In addition said casing 24 is rendered pivotable about the axes of said screws 44 in the direction of Y—Y' shown in FIG. 4A, whereby said casing 24 can be fixed at an arbitrary position with respect to said photosensitive drum.

Thus the casing 24 is moved in the directions X—X' and Y—Y' to a position wherein the laser beam can be brought to a determined position on the photosensitive drum 3 when the laser unit 23 is mounted on a laser unit mounting face 45 of said casing 24 and a deflector unit 46 is mounted on a deflector unit mounting face 47 on said casing, and firmly fixed in said position to the frames 30-1 by means of said screws 44-1, 44-2.

The laser unit 23 is composed of a semiconductor laser device 48 structured integrally with a collimeter lens 49, said semiconductor laser device 48 being adapted to emit an intensity modulated laser beam in response to an external input signal, said laser beam being introduced into said collimating lens 49. Said semiconductor laser device 48 and collimating lens 49 are mutually positioned by means of a jig in such a manner that the laser beam coincides with the optical axis of said collimating lens 49 and the light-emitting face coincides with the focal point of said lens 49, as to be explained more detailedly in the following. Because of such arrangement the laser beam emitted by the semiconductor laser device 48 is converted, after being transmitted by said lens 49, into a parallel beam the direction of which coincides with the optical axis of said collimating lens 49. Said laser unit 23 is fitted into the opening of a mounting ring 50 of the beam expender system 25 affixed on the laser mounting face 45 of said casing 24 whereby said unit being positioned, by means of an outer periphery coaxial with said collimating lens 49, with respect to the casing 24. The parallel beam emergent from said collimating lens 49 is introduced into the inlet aperture of the beam expander system 25 which is inserted for the purpose of converting the cross-sectional beam pattern of said parallel beam as represented by 52 into a beam pattern suitable for forming a spot on the photosensitive drum 3 as represented by 53 and which may be eventually dispensed with. The beam expander 25 is fitted into the opening of said expander mounting ring 50 having a flange 54 coaxial with the optical axis of said beam expander 25, said flange 54 being fitted with said outer periphery 51 to maintain said laser unit 23 in a determined position with respect to said beam expander system 25. Consequently the laser beam emergent from the collimating lens 49 is automatically guided on the optical axis of the beam expander 25, whereby the axis adjustment between these two units can be totally eliminated. Besides the beam expander 25 is already adjusted in the axial direction at the assembly thereof to avoid the necessity of adjustment at the mounting on the casing 24.

The laser beam emergent from and put into a substantially horizontal sweeping motion by the polygonal mirror is focused as a spot on said photosensitive drum 3 by means of an f-θ lens 28 having an f-θ characteristic, said polygonal mirror and said lens constituting an integral deflector unit 46, which is mounted on a deflector unit mounting face 47 by means of a jig in such a manner that the scanning position of said laser beam on the photosensitive drum 3 is maintained at a determined height with respect to said mounting face 47 and parallel thereto, said deflector unit 26 being positioned and fixed on said casing 24 by means of the flanges and positioning pins to be fitted into the corresponding openings provided on said mounting face 47.

There is provided a beam detector unit 58 composed, as will be explained later more detailedly, of a mirror 55, a slit plate 56 having a small entrance slit and a rapid-response photoelectric converting element 57 such as a PIN diode for the purpose of detecting the position of the laser beam in scanning motion and determining, by the detection signal thus obtained, the start timing of the input signals to the semiconductor laser device for giving desired information to the photosensitive drum 3. In this manner it is rendered possible to significantly reduce the aberration in the horizontal signal synchronization resulting from eventual unevenness in the rotation of said polygonal mirror thereby improving the image quality and to allow a larger tolerance to said mirror thereby enabling a cheaper manufacture thereof. Said beam detector unit 58 is mounted on the casing 24 with a suitable positioning achieved by two positioning pins.

In this manner the modulated laser beam irradiates the photosensitive drum 3, then is converted into a visible image by the aforementioned electrophotographic process and is transferred onto a transfer sheet 11 composed of a plain paper to obtain a hard copy.

As explained in the foregoing, the various units constituting the optical section 2 of the present invention are respectively adjusted and mounted on the casing 24 by means of suitable positioning means so as to satisfy the respective requirements, so that the adjustment after the mounting thereof is made totally unnecessary. For this reason said units have excellent reproducibility in case of eventual detachment and reassembly and excellent interchangeability in the unit replacement. Besides the simple structure having no other mirrors than the polygonal mirror in the optical path for forming the laser beam to be directed toward the photosensitive drum 3 allows easy assembly and adjustment and provides little possibility of optical path displacement resulting for example from mechanical vibration, thus assuring a high reliability.

As explained in the foregoing, the laser beam put into scanning motion by the polygonal mirror is introduced into the beam detector unit 58 including the mirror 55, wherein the photoelectric transducer 57 detects the position of the sweeping laser beam to control the start timing of the input signal to the semiconductor laser device for providing the photosensitive drum 3 with desired optical information. Such photoelectric transducer is however defective in that it tends to cause erroneous functions by the circumferential electric noises. In the present embodiment, therefore, such erroneous function is avoided by an electric shield provided around said photoelectric transducer 57. Besides said photoelectric transducer 57 and the beam detector unit 58 are positioned with respect to the casing 24 in order to ensure satisfactory mounting reproducibility and interchangeability.

Figure 5:
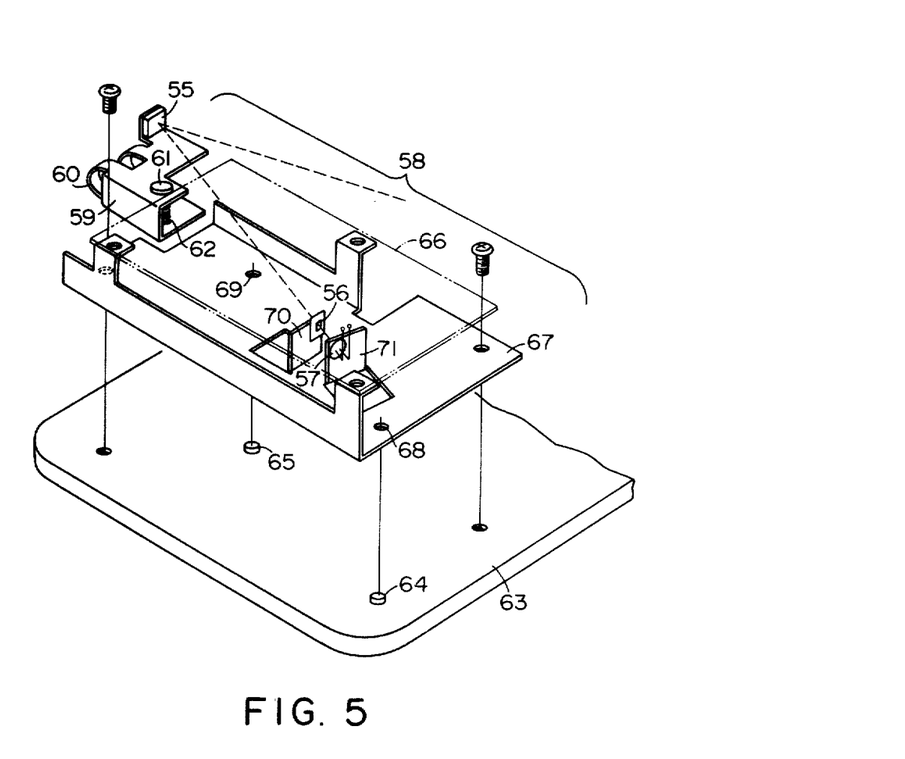
FIG. 5 is an exploded perspective view of a part of said recording apparatus.
Figure 6:
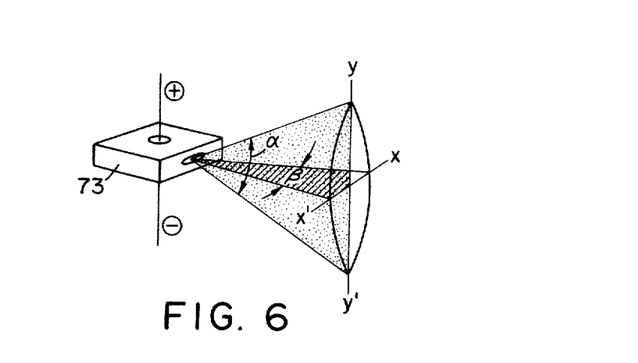
FIG. 6 is a perspective view of a semiconductor laser element.

Now the beam detector unit 58 will be explained in detail in the following explanation with particular reference to the FIGS. 5 and 6. The mirror 55, which is affixed to a mirror holder 59, reflects the laser beam put in the scanning motion by means of the polygonal mirror. Said mirror holder 59 is structured deformable at a bent portion 60 thereof and is therefore capable of adjusting and fixing the mirror 55 at a desired-position by means of an adjust screw 61 and a spring 62, whereb the laser beam reflected by said mirror 55 is brought t a height of the light-receiving face of said photoelectri transducer 57. On the mounting face 63 for the bear detector unit the casing is provided with two positior ing pins 64, 65, while a base plate 67 for mounting printed circuit board 66 including the photoelectri transducer 57 is provided, in positions corresponding t said positioning pins 64, 65, with a hole 68 to be snugl fitted with said pin 64 and an elongated hole 69 of whic shorter diameter is equal to that of the pin 65 and long diameter is directed toward the center of said hole 6 whereby said base plate 67 is positioned with respect t and affixed to said casing 24 by means of said positior ing pins 64, 65 and said holes 68, 69. Said base plate 6 is further provided with two vertically raised membe 70, 71 in positions well defined with respect to sai holes 68, 69, said member 70 being provided for sup porting a small entrance slit plate 56 for improving th output wave form from said photoelectric transducer 5 while the other member 71 is provided for supportin said transducer 57.

In the following there will be given a more detaile explanation on said laser unit, comprising a semicondu tor laser element having long service life and a stabl laser output, a temperature controlling member fc stabilizing the output laser beam from said laser ele ment, a collimating lens unit for forming said laser bea into a parallel beam and an adjusting mechanism.

Said laser unit is advantageous in:
(1) the interchangeability of the laser unit, as:
   the laser output beam is vertical to the standar mounting face, and
   the laser output beam is coaxial to the fitting po tion for determining the mounting position;
(2) the possibility of easy adjustment of three indi pensable factors for the semiconductor laser an the collimating lens, i.e.:
   adjustment of direction of semiconductor laser;
   adjustment of optical axis of semiconductor lase and collimating lens; and
   focus adjustment of collimating lens achievable b means of a compact, light and inexpensive mech anism; and
(3) the absence of focus displacement of the collimat ing lens resulting from thermal expansion.

As the collimating lens has an extremely small foca depth ($\pm 3.6 \mu m$), the eventual thermal expansion of th semiconductor laser unit may result in displacement c focal position, thus leading to a defective collimatior but such drawback can be prevented by the laser unit c the present invention.

Figure 7:
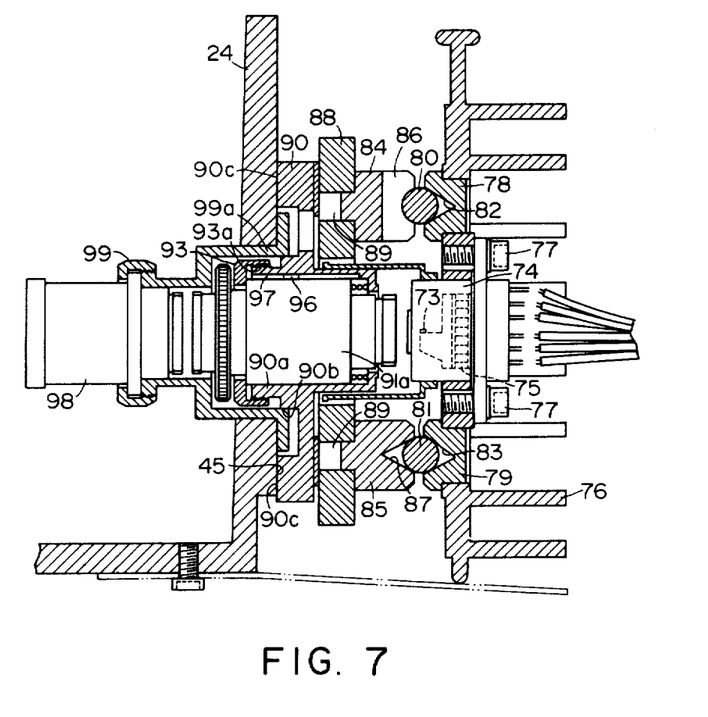
FIG. 7 is an upper cross-sectional view.
Figure 8:
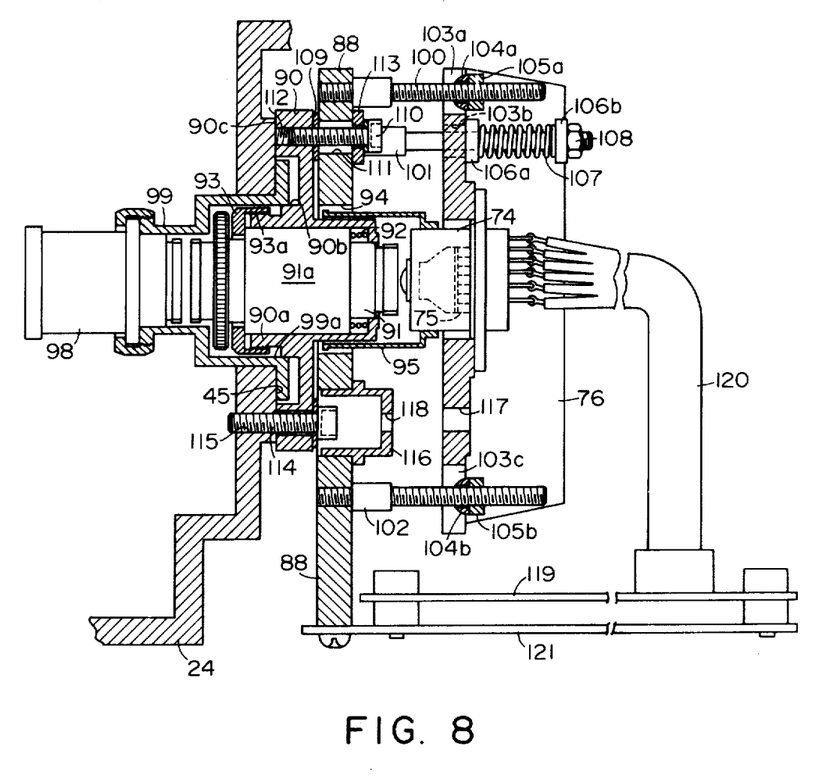
FIG. 8 is a lateral cross-sectional view and FIG. 9 is a rear view thereof.
Figure 9:
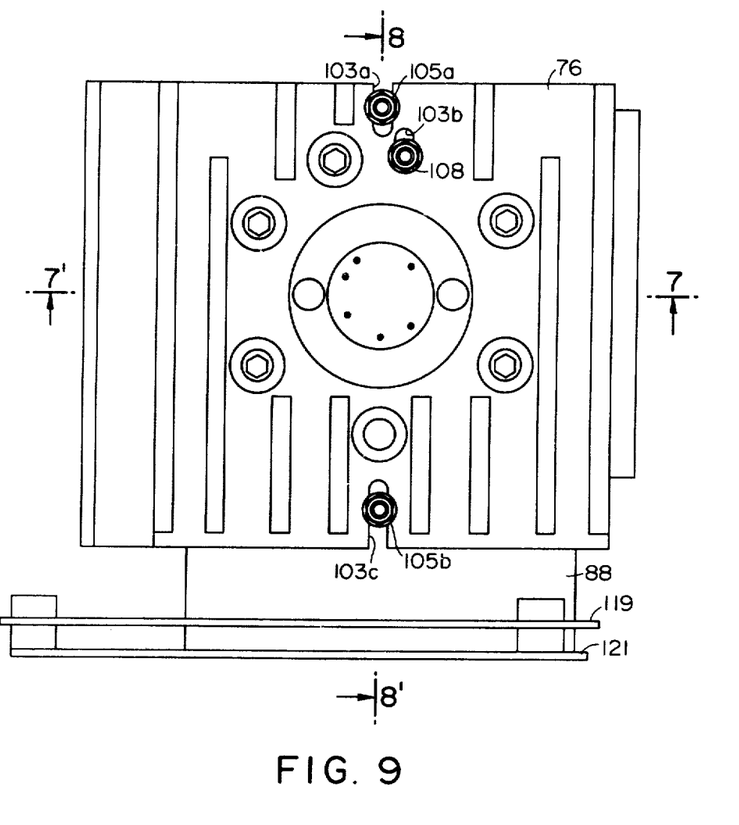

Now there will be given an explanation on an em bodiment of said laser unit shown in FIGS. 7 to 9 wherein FIG. 7 is a plan view of a horizontal cros section thereof along the optical axis, FIG. 8 is a latera view of a vertical cross section along said optical axis and FIG. 9 is a rear view.

In FIGS. 7 to 9 there are shown a semiconducto laser device 74 including therein a semiconductor lase element 73 combined with a Peltier element 75 for cool ing said laser element and an unrepresented temperatur detecting element to be explained later, a heat sink 7 for dissipating the heat generated by said semiconduc tor laser device from integrally formed fins and fo firmly supporting said laser device 74 by means o screws 77, and ball bearing seats 78, 79 which are firml fitted into said heat sink 76 and are provided with coni cal recesses 82, 83 for receiving balls 80, 81 for adjusting the direction of the semiconductor laser device, wherein the line connecting the centers of said two balls 82, 83 being designed to coincide with the light-emitting face of the semiconductor laser element 73. As shown in FIG. 6, the semiconductor laser element 74 emits a beam of a conical cross section having an emergent angle α in the direction of the junction of said laser and a smaller emergent angle β in the perpendicular striped direction. The above-mentioned balls 82, 83 are positioned in such a manner that the line connecting the centers thereof is parallel to a plane yy' in the direction of said junction whereby said laser element 73 is rendered pivotable in said striped direction.

84 and 85 are other ball seats provided in facing relationship to said ball seats 78, 79 to support said balls 80, 81, wherein said seat 84 being provided with a V-shaped groove 80 extended in a direction parallel to the plane of drawing while said seat 85 is provided with a conical recess 87 to be engaged with said balls 80, 81.

88 is a base plate having holes 89 into which said ball seats 84, 85 are firmly fitted.

90 is a collimeter support ring constituting the aforementioned peripheral portion 51 and having a cylindrical portion 90a in which an outer tube 91a of the collimeter unit 91 is axially displaceably fitted and resiliently biased, by means of a spring 92, against a focusing ring 93. Said outer tube 90a is inserted into an opening 94 provided in said base plate 88 and projects therefrom toward the semiconductor laser device 74.

Between said outer tube 90a and said laser device there is provided a cylindrical rubber tube 95 to prevent the air intrusion therebetween.

Said focusing ring 93 is provided with a threaded portion 93a fitted into a corresponding threaded portion of said collimeter support ring 90, whereby the rotation of said focusing ring causing an axial displacement of the collimeter unit 91.

The outer tube 91a of said collimeter unit is provided with a guide pin 96 which engages with a guide groove 97 formed on the cylindrical portion 90a of said collimeter support ring 90, whereby the collimeter unit 91 is displaced in the axial direction for focusing without rotation about the optical axis when said focusing ring 93 is rotated.

98 is a cylindrical beam expander unit (hereinafter abbreviated as CBE unit) which is mounted, by means of a CBE mounting tube 99, on the laser unit mounting face 45 of the casing 24.

Said collimeter support ring 90 is provided with a mounting portion 90b and a standard face 90c, and the mounting of the laser unit on the casing 24 is achieved by placing said standard face 90c on said laser unit mounting face 45 of the casing 24 and fitting said mounting portion 90b into the internal face 99a of the CBE unit mounting tube 99.

Now there will be explained the connection between the base plate 88 and the heat sink 76 while making reference to FIG. 8.

As already explained in connection with FIG. 7, said base plate 88 and the heat sink 76 are made pivotable, by means of said balls 80, 81, about an axis passing the light-emitting face of said semiconductor laser element 73.

As shown in FIG. 8, the base plate is provided with three adjust rods 100, 101, 102 protruding toward the heat sink 76 and penetrating through elongated holes 103a, 103b, 103c provided therein. Said rods 100 and 102 are respectively provided with heat sink press plates 104a, 104b formed spherical on one side thereof and nuts 105a, 105b to bias the heat sink 76 toward the base plate 88, while said rod 101 is provided with spring support plates 106a, 106b, a compression coil spring 107 and a nut 108 to resiliently bias the heat sink 76 toward the base plate 88, thereby defining the position of the heat sink 76 with respect to that of the base plate 88, or the position of the semiconductor laser device with respect to that of the collimeter unit 91.

More specifically, the semiconductor laser device can be pivoted about an axis perpendicular to the plane of FIG. 8 and passing through the light-emitting face of the semiconductor laser element by rotating the nut 105b while the nut 105a is loosened, as the heat sink 76 is constantly biased, in a portion thereof corresponding to the elongated hole 103b, toward the base plate 88 by means of the spring 107.

Consequently it is possible to obtain a determined positional relationship between the collimeter unit 91 and the semiconductor laser device by rotating the nut 105b so as to bring the optical axis of the emergent laser beam to the optical axis of said collimeter unit 91 and then tightening the 105a.

A face 88a of the base plate 88 is displaceable on the face 90d of aid collimeter support ring 90 by means of an eccentric washer 109.

A fixing screw 110 passes through a hole 111 of the base plate 88 and said eccentric washer 109 and is screwed into a threaded hole 112 of said collimeter support ring 90, said hole 111 having a dimension sufficient to allow the displacement of the base plate 88 with respect to said ring 90. In addition there are provided two other similar sets of threaded hole 112, hole 111, screw 110 and washer 109 which are located, though not represented on the drawing, at equl distances on a circle having the center on the optical axis of the collimeter unit 91 and the center of hole 94.

113 is a washer for supporting the head of said fixing screw 110 above said hole 111 of the base plate 88. In this manner the semiconductor laser device 74 is displaceable with respect to the collimeter unit 91 within the extent of the play in said hole 111 thereby allowing the positional adjustment of the semiconductor laser device in such a manner that the laser beam emitted thereby is brought to the center of the collimeter unit.

The collimeter support ring 90 is further provided with three holes 115, only one of which is shown on the drawing, distanced equally on a circle having the center at the optical axis of the collimeter and receiving three screws 114 to affix said ring 90 on the casing 24 thereby mounting the laser unit to the casing 24.

On each screw 114 there is provided a cap 116 adhered to the base plate 88 and holding said screw 114 when it is detached from the casing 24, so that said screw 114 can be easily screwed in by inserting a screw driver through a hole 117 of the heat sink 76 and a hole 118 of said cap at the mounting to the casing 24.

119 is a printed circuit board containing a driver circuit for the semiconductor laser device, said board being electrically connected to said laser device through a flexible cord 120.

121 is a support plate for said printed circuit board 119 and affixed at an end thereof to the base plate 88.

As the collimeter unit and the semiconductor laser unit are combined as a single laser unit allowing independent optical axis adjustment therein, the mounting to the casing 24 can be easily achieved without any particular adjustment.

Figure 10:
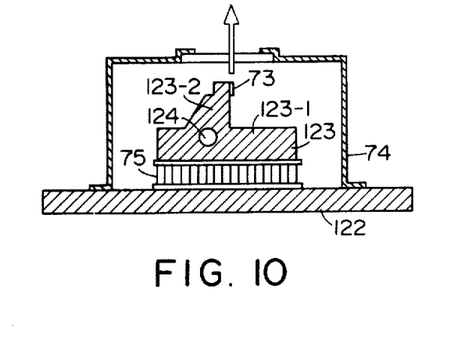
FIG. 10 is a cross-sectional view of a semi-conductor laser device.

FIG. 10 shows in a cross-sectional view a semiconductor laser device 74 applicable in the present invention, wherein a Peltier element 75 is provided on a base plate 122 composed of a metal of a high thermal conductivity, and on top of said Peltier element there is affixed a substrate member 123 composed of a metal of a high thermal conductivity such as copper, said substrate member being composed of a substrate portion 123-1 maintained in initimate contact with said Peltier element 75 and a mounting portion 123-2 extending upward from said substrate portion 123-1 and holding a semiconductor laser element 73 at the upper end thereof.

In said substrate member 123 and between said substrate portion 123-1 and mounting portion 123-2 there is provided a hole 124 for totally or partially housing an unrepresented temperature detecting element such as a thermister for measuring the temperature of the semiconductor laser element 73.

Figure 11:
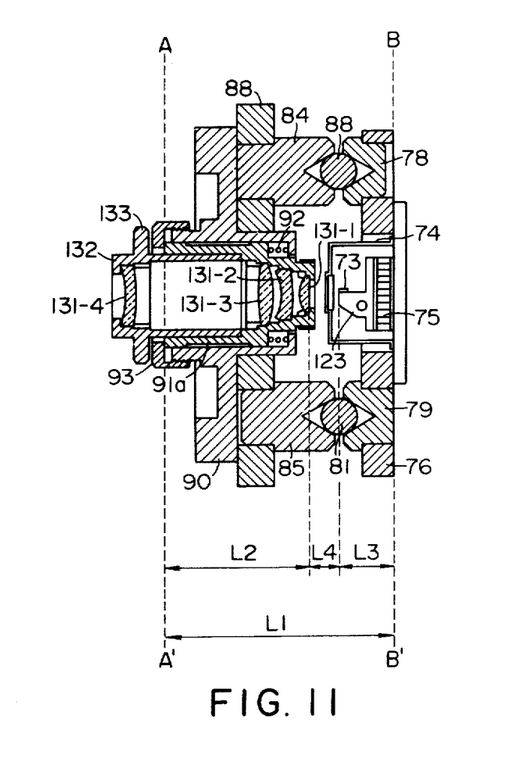
FIG. 11 is a lateral cross-sectional view of the laser unit.

Now the mechanism for preventing the undesirable effect of heat generated by the laser unit explained in relation to FIGS. 7 to 9 will be further clarified in the following explanation referring to FIG. 11, in which the components which are the same as those in other drawings are represented by the same numbers.

As already explained in the foregoing, the collimating lens has a very narrow focal depth so that even a very slight change in the distance between the semiconductor laser and the collimating lens may result in defective functioning thereof.

According to the present invention, therefore, the above-mentioned drawback is prevented by mutual compensation of the thermal deformations of the support members.

As explained in the foregoing, the outer tube 91a is constantly biased, by means of the spring 92, against the focusing ring 93 which is screwed into the collimeter support ring 90. On said ring 90 fixed is the base plate 88 having ball seats 84, 85 respectively supporting balls 80, 81, which in turn support the ball seats 78, 79 fixed on the heat sink 79 on which said semiconductor laser device 74 is mounted. Further as already explained, said laser device 74 is provided with the Peltier element 75, the substrate 123 fixed thereon and the semiconductor laser element 73 mounted thereon.

The collimeter lens is composed of lenses 131-1–131-3 fixed in said outer tube 91a and a lens 131-4 mounted on an inner tube 132 engaging with an unrepresented thread provided inside said outer tube 91a, wherein the distance of said lens 131-4 to the other lenses 131-3 is rendered adjustable by rotating a ring 133.

In such structure the semiconductor laser element 73 and the lens 131-1 are supported with a mutual distance L4 by the following supporting mechanisms.

The lens 131-1 is supported by the outer tube 91a (second support member) so as to be distanced by a length L2 from a first standard position represented by a line A—A', while the semiconductor laser element 73 is supported by the Peltier 75 and the substrate 123 (hereinafter collectively called third support members) so as to be distanced by a length L3 from a second standard position represented by a line B—B', and said second and third support members are maintained, by means of the focusing ring 93, collimeter support ring 90, base plate 88, ball seats 84, 85, balls 80, 81, ball seats 78, 79 and heat sink 76 (hereinafter collectively called first support members) at a mutual distance L1.

In order to ensure the expected performance in case of a temperature rise of t degrees of said second and third support members, from an optimum ambient temperature for which the apparatus is designed, the materials of said members should be selected in such a manner that the difference between the sum of thermal expansion of said second and third support members in the axial direction and the thermal expansion of said first support members in the axial direction remains within the focal depth of the collimating lens, wherein said focal depth being defined by:

2.44 x laser light wavelength x (focal length of collimating lens/effective aperture of collimating lens)$^2$.

More specifically the thermal expansion co-efficients $\alpha 1$, $\alpha 2$ and $\alpha 3$ of said first, second and third support members, and thermal expansion coefficient k of the focal length of the collimeter lens unit (representing the elongation in mm of the focal length for a temperature rise of 1° C.) should be selected, for a temperature rise of t° C., so as to satisfy the following relation;

$t \cdot x \ [(L2 \cdot \alpha 2 - L3 \cdot \alpha 3 + k) - L1 \cdot \alpha 1] <$ focal depth of the collimeting lens unit.

In this manner the variation of the aforementioned length L4 can be maintained constantly within the focal depth of the collimeter lens unit.

The substrate 123 is maintained at a constant temperature so that the temperature change thereof can be practically considered negligible.

As explained in the foregoing, the apparatus of the present invention is capable of maintaining a constant distance between the collimating lens unit and the laser device without the effect of thermal expansion of the support members even under a change in temperature.

What we claim is:

1. A laser recording apparatus, comprising:
   laser means comprising a laser element for emitting a laser beam;
   optical means supporting said laser means, said optical means receiving the laser beam therefrom at an entrance end and emitting a collimated laser from an exit end thereof, said optical means being provided with a mounting standard face, wherein the difference between the distance of the laser element from said standard face and the distance of the entrance end from said standard face are maintained within the focal depth of said optical means even in the presence of a temperature change;
   a support member comprising a mounting standard face on which is affixed said mounting standard face of said optical means; and
   deflector means for directly receiving the laser beam from said optical means and directing said laser beam toward a recording medium.

2. An apparatus according to claim 1, further comprising a cover encircling a space between said laser means and said optical means.

3. A laser recording apparatus according to claim 1, wherein said laser means and optical means are constructed of materials having thermal expansion coefficients which ensure that the difference between the distance of the laser element from said standard face and the distance of the entrance end from said standard face are maintained within the focal depth of said optical means during temperature changes.

* * * * *